United States Patent [19]
Narahara

[11] Patent Number: 5,886,551
[45] Date of Patent: Mar. 23, 1999

[54] CHARGE PUMP CIRCUIT FOR USE IN A PHASE LOCKED LOOP

[75] Inventor: Tetsuya Narahara, Tokyo, Japan

[73] Assignee: NEC Corporation, Tokyo, Japan

[21] Appl. No.: 823,681

[22] Filed: Mar. 25, 1997

[30] Foreign Application Priority Data

Mar. 28, 1996 [JP] Japan .................................... 8-074896

[51] Int. Cl.⁶ .................................................. H03L 7/06
[52] U.S. Cl. ........................................ 327/157; 327/156
[58] Field of Search ......................... 327/147, 148–150, 327/154–159, 161, 536, 537; 331/17; 375/373, 375, 376

[56] References Cited

U.S. PATENT DOCUMENTS

| 5,008,637 | 4/1991 | Ray ............................................... 331/8 |
| 5,208,546 | 5/1993 | Nagaraj et al. .......................... 327/148 |

FOREIGN PATENT DOCUMENTS

| 1177867 | 7/1989 | Japan . |
| 263219 | 3/1990 | Japan . |
| 3126257 | 5/1991 | Japan . |
| WO 95/04405 | 2/1995 | WIPO . |

OTHER PUBLICATIONS

I.A. Young et al.; "A PLL Clock Generator with 5 to 110 MHz of Lock Range for Microprocessors"; IEEE Journal of Solid–State Circuits, vol. 27, No. 11, Nov. 1992, pp. 1599–1606.

Megmet Soyuer et al: "A Fully Monolithic 1.25GHZ CMOS Frequency Synthesizer", pg. 127, paragraph entitled Circuit Design; figures 1, 3.

*Primary Examiner*—My-Trang Nu Ton
*Attorney, Agent, or Firm*—Whitham, Curtis & Whitham

[57] ABSTRACT

A charge pump circuit in a phase locked loop comprises a main circuit block and an excess current cancel block for canceling a spike current. The spike current is generally supplied by a parasitic capacitance in the main circuit block and generates a jitter in the output of the phase locked loop. The excess current cancel block supplies or drains a cancel current which is substantially equal to the spike current but flows in a reverse direction.

15 Claims, 10 Drawing Sheets

(a)

(b)

CHARGE PUMP CIRCUIT FOR USE IN A PHASE LOCKED LOOP

BACKGROUND OF THE INVENTION (a) Field of the Invention

The invention relates to a charge pump circuit for use in a phase locked loop.

(b) Description of the Related Art

As is well known in the art, a phase locked loop (PLL) comprises a loop filter including a capacitor therein, a voltage controlled oscillator (VCO), a frequency divider, a phase/frequency comparator, and a charge pump circuit cascaded to form a feed-back loop. The loop filter functions as a low pass filter (LPF), and produces a control voltage across the capacitor terminals, the control voltage controlling the VCO to generate an output signal of the PLL having a frequency in response to the control voltage. The frequency divider divides the frequency of the output signal in accordance with a specified factor, thus producing a divided-frequency signal. The phase/frequency comparator, or phase/frequency detector, compares the divided-frequency signal against an input reference frequency signal, and detects a phase/frequency difference between the reference frequency signal and the divided-frequency signal, so as to generate UP/DOWN signals based on the phase/frequency difference between both the signals. In response to UP signal, the charge pump circuit provides electric charge to the loop filter, thereby charging the capacitor therein. Also, in response to DOWN signal, the charge pump circuit drains electric charge from the loop filter, thereby discharging the capacitor therein.

FIG. 1 shows a charge pump circuit 601 for use in the PLL as a first conventional technique. The charge pump circuit 601 has a first input terminal 61 for receiving UP signal, a second input terminal 62 for receiving DOWN (DN) signal, an output terminal 63 through which electric charge is provided to or drained from the loop filter by flowing a control current $I_P'$, a power supply terminal 64 connected to line voltage +Vdd, and a ground terminal 65 for grounding. UP signal is active at a low level thereof while DN signal is active at a high level thereof.

The charge pump circuit 601 comprises therein a first (constant) current source 71, a first P-channel MOSFET 72, a second (constant) current source 73, and a first N-channel MOSFET 74. The first current source 71 is connected to the power supply terminal 64 for supplying a first constant current $I_{P1}$. The first P-channel MOSFET 72 has a source connected to the first current source 71, a gate for receiving UP signal and a drain connected to the output terminal 63 of the charge pump circuit. The first P-channel MOSFET 72 supplies first constant current $I_{P1}$ to the output terminal 63 in response to UP signal. The second current source 73 is connected to the ground terminal 65 for supplying a second constant current $I_{P2}$. The first N-channel MOSFET 74 is connected between the second current source 73 and the output terminal 63 for draining the second constant current $I_{P2}$ from the output terminal put 63 in response to DN signal.

During the time period the first P-channel MOSFET 72 or first N-channel MOSFET 74 is on, the output terminal 63 is charged or discharged by the first constant current $I_{P1}$ or $I_{P2}$, thus controlling the current signal IP' for the loop filter. In other words, the charge pump circuit 601 delivers or drains electric charge, depending on the pulse width of UP signal or DN signal, to or from the loop filter. Thus, the output frequency of the VCO varies in accordance with the control voltage delivered through the loop filter.

It will be noted that each of the MOSFETs 72 and 73 has a junction capacitance, and accordingly, first and second parasitic capacitances C1 and C2 are formed from a first node N1 between the first current source 71 and the first P-channel MOSFET 72 to the ground, and from a second node N2 between the second current source 73 and the first N-channel MOSFET 74 to the ground, respectively.

Referring additionally to FIG. 2 for showing the signal waveforms in the charge pump circuit, the operation of the charge pump circuit 601 of FIG. 1 will be described. When UP signal falls to be active, the first P-channel MOSFET 72 is turned on to supply a current signal $I_P'$ which includes a first constant current Ip1 and a spike current $I_{OC1}$ superposed to the first constant current $I_{P1}$ at the leading edge thereof, the spike current $I_{OC1}$ being supplied from the first parasitic capacitance C1.

Similarly, when DN signal rises to be active, the first N-channel MOSFET 74 is turned on to supply a current signal $I_P'$ which includes the second constant current $I_{P2}$ and a spike current $I_{OC2}$ superposed to the second constant current $I_{P2}$ at the leading edge thereof, the spike current $I_{OC2}$ being supplied from the second parasitic capacitance C2.

The spike currents $I_{OC1}$ and $I_{OC2}$ have respective magnitudes independently of the pulse width of UP or DN signal. Accordingly, after the PLL is locked in phase with the reference signal, wherein the magnitude of a phase/frequency difference $\Delta f0$ supplied from the phase/frequency comparator is reduced to a minimum, a significant variation occurs in the control voltage for the VCO, whereby the output signal of the VCO includes a jitter, such as shown in FIG. 3.

FIG. 4 shows a second conventional charge pump circuit, wherein like constituent elements are designated by like reference numerals in FIGS. 1 and 2 and other drawings. The charge pump circuit 602 is similar to the charge pump circuit 601 of FIG. 1 except that the first and second constant current sources 71 and 72 are connected between the output terminal 63 and the drains of the P-channel and N-channel MOSFETs 72 and 74, respectively. In this configuration, parasitic capacitances C1 and C2 are associated with the drains of the P-channel and N-channel MOSFETs 72 and 74, respectively.

Referring additionally to FIG. 5 showing, similarly to FIG. 3, signal waveforms in the charge pump circuit 602 of FIG. 4, the output current signal $I_P''$ to the loop filter includes the first constant current $I_{P1}$ and a spike current $I_{OC1}'$ at the trailing edge thereof when UP signal is active, and includes the second constant current $I_{P2}$ and a spike current $I_{OC2}'$ at the trailing edge thereof when DN signal is active, both the spike currents $I_{OC1}'$ and $I_{OC2}'$ being supplied from the parasitic capacitnaces C1 and C2, respectively. The output of the VCO receiving the current signal $I_P''$ includes a jitter similarly to the case of the first conventional charge pump circuit 601.

In order to solve the problem jitter as described above, there has been a technique proposed in which the influence of the parasitic capacitance is eliminated by maintaining a junction associated with the parasitic capacitance at the same potential as the output terminal 63. The technique is disclosed by Ian A. Young et al in IEEE JOURNAL OF SOLID-STATE CIRCUITS, VOL.27, NO.11, NOVEMBER 1992, entitled "A PLL Clock Generator with 5 to 110 MHZ of Lock Range for Microprocessors" (third conventional technique).

FIG. 6 shows a charge pump circuit generally designated at 603, which is substantially identical to the disclosure of the article as mentioned above. The charge pump circuit 603 comprises a main circuit block 70 similar to the charge pump circuit 601 of FIG. 1 and an additional, potential-equalizing block 90.

The potential-equalizing block 90 comprises a first and a second inverters 91 and 92, a second P-channel MOSFET 93, a second N-channel MOSFET 94, and a unity gain amplifier, voltage follower 95, implemented by an operational amplifier 951.

In the voltage follower 95, the operational amplifier 951 has a non-inverting input connected to the output terminal 63 of the charge pump circuit 603, and an inverting input connected to the output 951*a* of the operational amplifier 951, which constitutes the output 95*a* of the voltage follower 95. The first inverter 91 inverts UP signal to supply an inverted UP (XUP) signal, and the second inverter 92 inverts DN signal to supply an inverted DN (XDN) signal.

The second P-channel MOSFET 93 includes a source connected to the node N1 associated with the first parasitic capacitance C1, a drain connected to the output 95*a* of the voltage follower 95, and a gate for receiving XUP signal. The second N-channel MOSFET 94 includes a source connected to the node N2 associated with the second parasitic capacitance C2, a drain connected to the output 95*a* of the voltage follower 95, and a gate for receiving XDN signal.

With the described arrangement, during a time interval when the first P-channel MOSFET 72 is off, the node N1 is maintained at the potential Vc of the output terminal 63, which is the control voltage supplied to the loop filter. Similarly, during a time interval when the first N-channel MOSFET 74 is off, the node N2 is maintained at the control voltage Vc of the output terminal 63. In this manner, the influence of the charge supplied from the parasitic capacitances C1 and C2 can be eliminated.

Another charge pump circuit similar to the charge pump circuit 603 of FIG. 6, except that the MOSFETs 93 and 94 shown in FIG. 6 are of normally off type, is described in Patent Publication NO. JP-A-1989-177,867 (fourth conventional technique).

Another charge pump circuit is also known for reducing the influence of a parasitic capacitance. For example, Patent Publication No. JP-A-1991-126,257 describes a CMOS charge pump circuit in which a P-channel MOSFET in the first current source and the first P-channel MOSFET such as shown in FIG. 1 are formed in a common diffused region, and an N-channel transistor in the second current source and the first N-channel MOSFET such as shown in FIG. 1 are formed in another common diffused region (fifth conventional technique). Patent Publication NO. JP-A-1990-63,219 describes another charge pump circuit which additionally includes a P-channel MOSFET which serves for maintaining a potential at the node between the output terminal and the drain of the P-channel MOSFET in the first current source at a voltage in the vicinity of a threshold voltage, and an N-channel MOS transistor which serves for maintaining a potential at the node between the output terminal and the drain of the N-channel MOSFET in the second current source at a voltage in the vicinity of the threshold voltage (sixth conventional technique).

Those approaches indicated by the third and fourth conventional techniques has disadvantages of a high fabrication cost and an increased layout area because of an increased number of elements required. In addition, the approaches have a draw back of a slow operational speed because the operational amplifier has a time delay as large as on the order of 10 nanoseconds. Further, the operational amplifier involves a higher power dissipation.

The approach suggested by the fifth conventional technique is to reduce the parasitic capacitance as much as possible, and thus it is unable to eliminate the influence of the parasitic capacitance. The approach suggested by the sixth conventional technique is to maintain a constant current from the parasitic capacitance to the output terminal, but also fails to eliminate the influence of the parasitic capacitance, as is the case of the fifth conventional technique.

SUMMARY OF THE INVENTION

In view of the above, it is an object of the invention to provide a charge pump circuit which substantially eliminates the influence of a parasitic capacitance, based on a concept, that the charge stored in the parasitic capacitor be canceled out, It is another object of the invention to provide a charge pump circuit, which operates at a high speed and a low power dissipation, and which has a small occupied area.

In accordance with the present invention, there is provided a charge pump circuit for use in a phase locked loop, which comprises a main circuit block for receiving a first pulse signal and a second pulse signal to output a first and second current signals through an output line of the charge pump circuit in response to the first pulse signal and second pulse signal, respectively, each of the first and second current signals having a pulse duration depending on a pulse duration of a corresponding one of the first and second pulse signals and including a spike current depending on a corresponding one of first parasitic capacitances in the main circuit block, and an excess current cancel block, having therein a second parasitic capacitance corresponding to each the first parasitic capacitance, for switching the second parasitic capacitance to the output line in response to a corresponding one of the firs and second pulse signals, to cancel the spike current.

In accordance with the charge pump circuit of the present invention, the spike current supplied from the parasitic capacitances in the main circuit block is canceled by the excess current cancel block by the parasitic capacitances in the excess current cancel block. Accordingly, the problem jitter can be substantially eliminated in the output of a phase locked loop having the charge pump circuit.

DESCRIPTION OF THE PREFERRED EMBODIMENTS

Before describing the preferred embodiments of the present invention, another possible approach to solve the problem jitter will be discussed. Specifically, it may be considered that it is sufficient to reduce the parasitic capacitances C1 and C2 in the conventional charge pump circuit. However, there is a limitation in reducing the parasitic capacitances C1 and C2 in a circuit design for the charge pump circuit, as detailed below.

Figure 1:
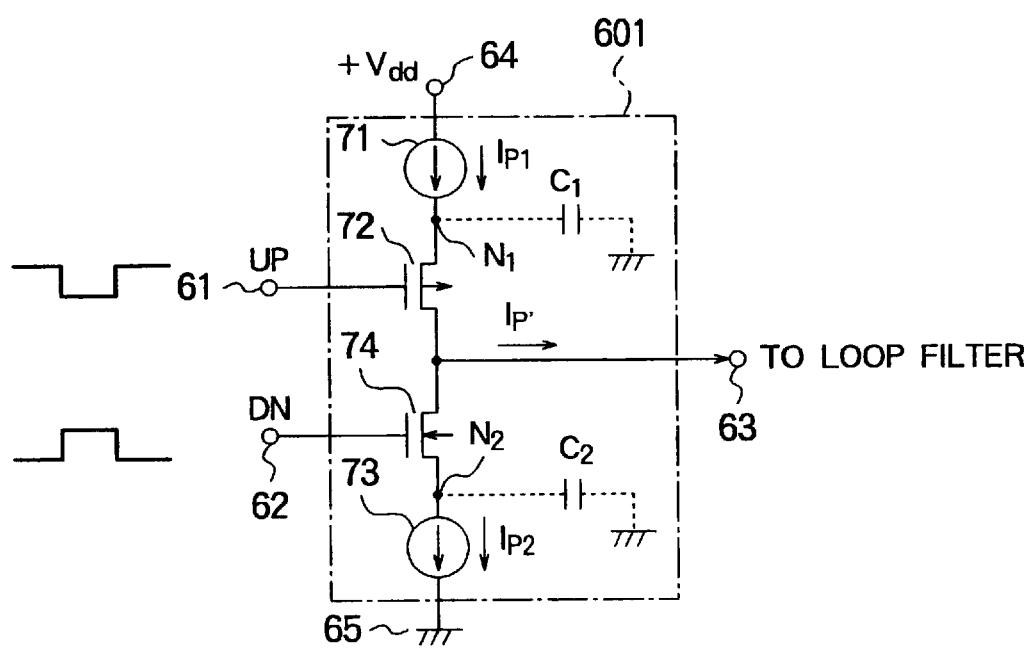
FIG. 1 is a circuit diagram of a first conventional charge pump circuit.
Figure 2:
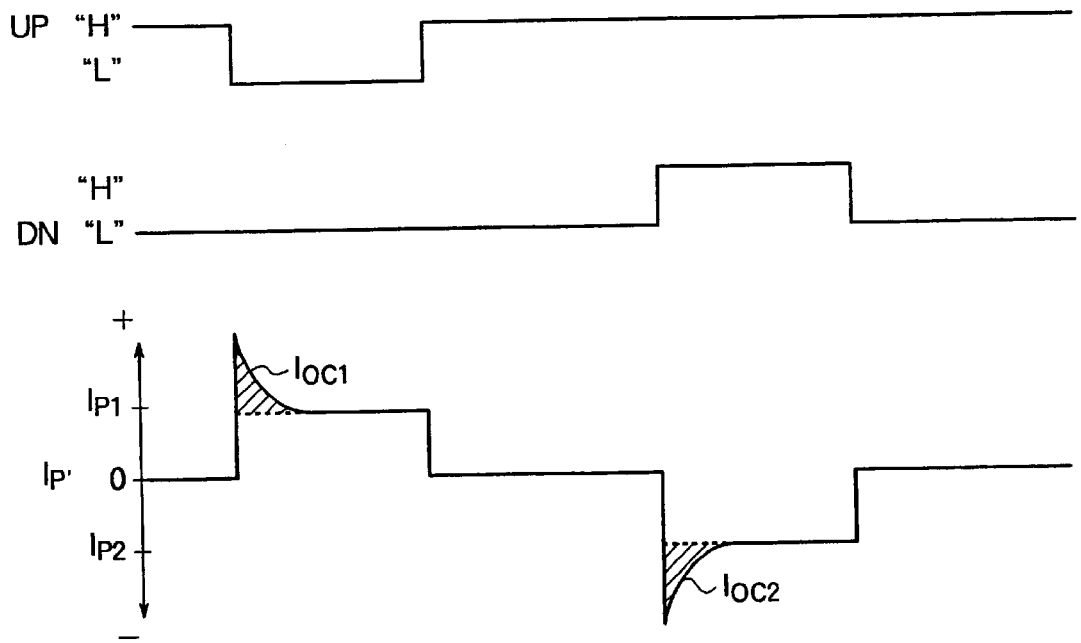
FIG. 2 is a series of timing charts for illustrating the signal waveforms in the charge pump circuit of FIG. 1.
Figure 3:
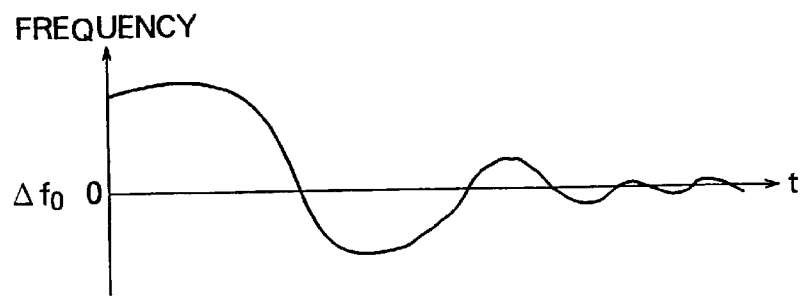
FIG. 3 is a signal waveforms output from a PLL having the charge pump circuit of FIG. 1.
Figure 4:
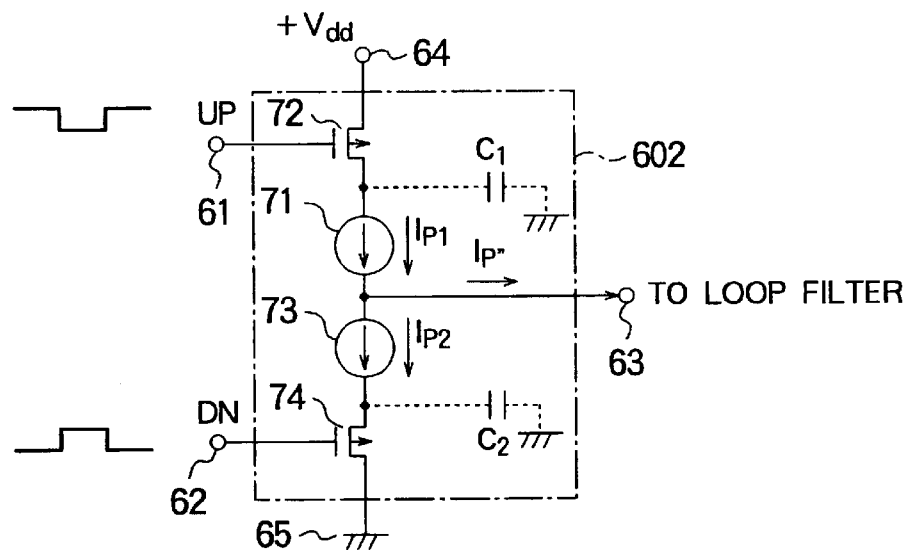
FIG. 4 is a circuit diagram of a second conventional charge pump circuit.
Figure 5:
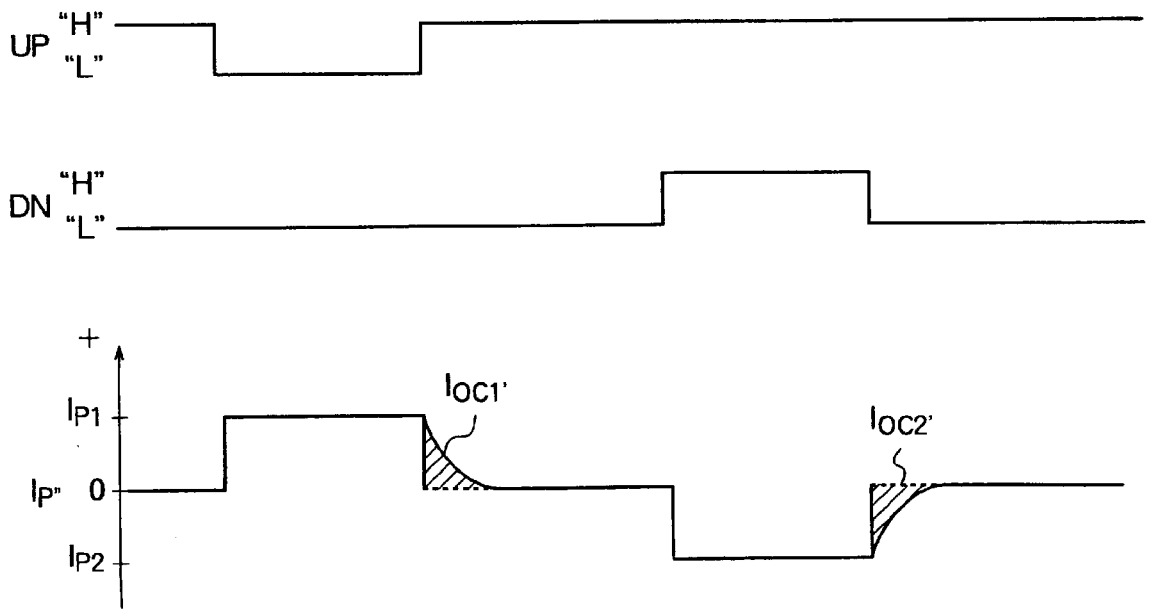
FIG. 5 is a series of timing charts for illustrating the signal waveforms in the charge pump circuit of FIG. 4.
Figure 7:
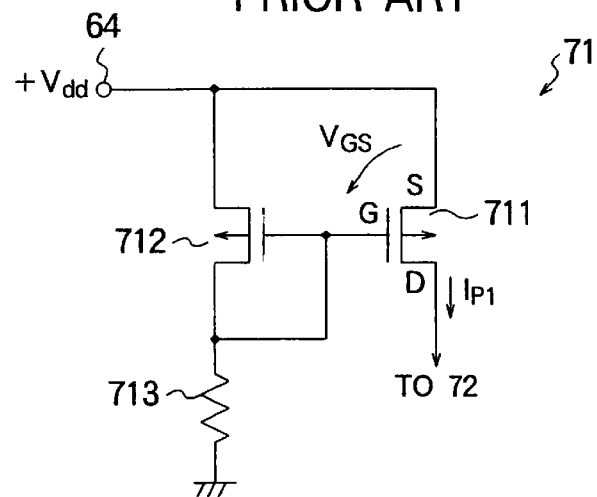
FIG. 7 is an exemplified circuit diagram of the first current source shown in FIG. 1.

FIG. 7 shows an exemplified circuit arrangement of the first current source 71 shown in FIG. 1. The first current source 71 comprises a current mirror including a pair of P-channel MOSFETs 711 and 712 and a resistor 713. Specifically, P-channel MOSFET 711 has a source (S) connected to the power supply terminal 64, a drain (D) connected to the first P-channel MOSFET 72 in FIG. 1, and a gate (G) connected to a node connecting the gate of P-channel MOSFET 712 with a resistor 713 having the other end connected to the ground. P-channel MOSFET 712 has a source connected to the power supply terminal 64, and a drain and a gate connected to the gate of P-channel MOSFET 711.

Figure 8A:
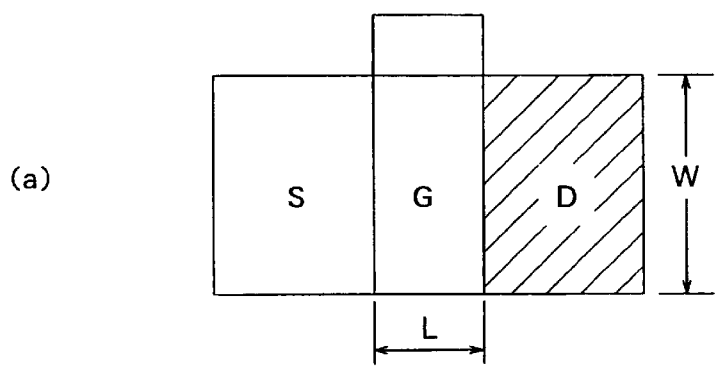
FIGS. 8A and 8B are plan view and a sectional view of the P-channel MOSFET shown in FIG. 7.
Figure 8B:
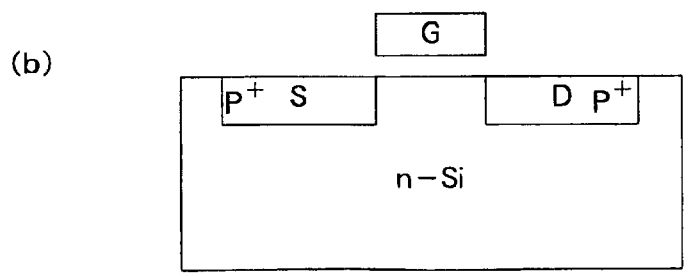

FIGS. 8A and 8B are plan view and a sectional view for illustrating a typical P-channel MOSFET. In FIG. 8A, gate (G) has a gate length L and a gate width W for the MOSFET, gate length L being designed for a specified current. The gate length L is also referred to as a channel length, and the gas width W as a channel width. The magnitude of the parasitic capacitance (or junction capacitance) for the MOSFET is defined by an area of a hatched drain (D), and accordingly, in order to reduce the parasitic capacitance, the area of the drain D or the gate width W must be reduced.

Figure 9:
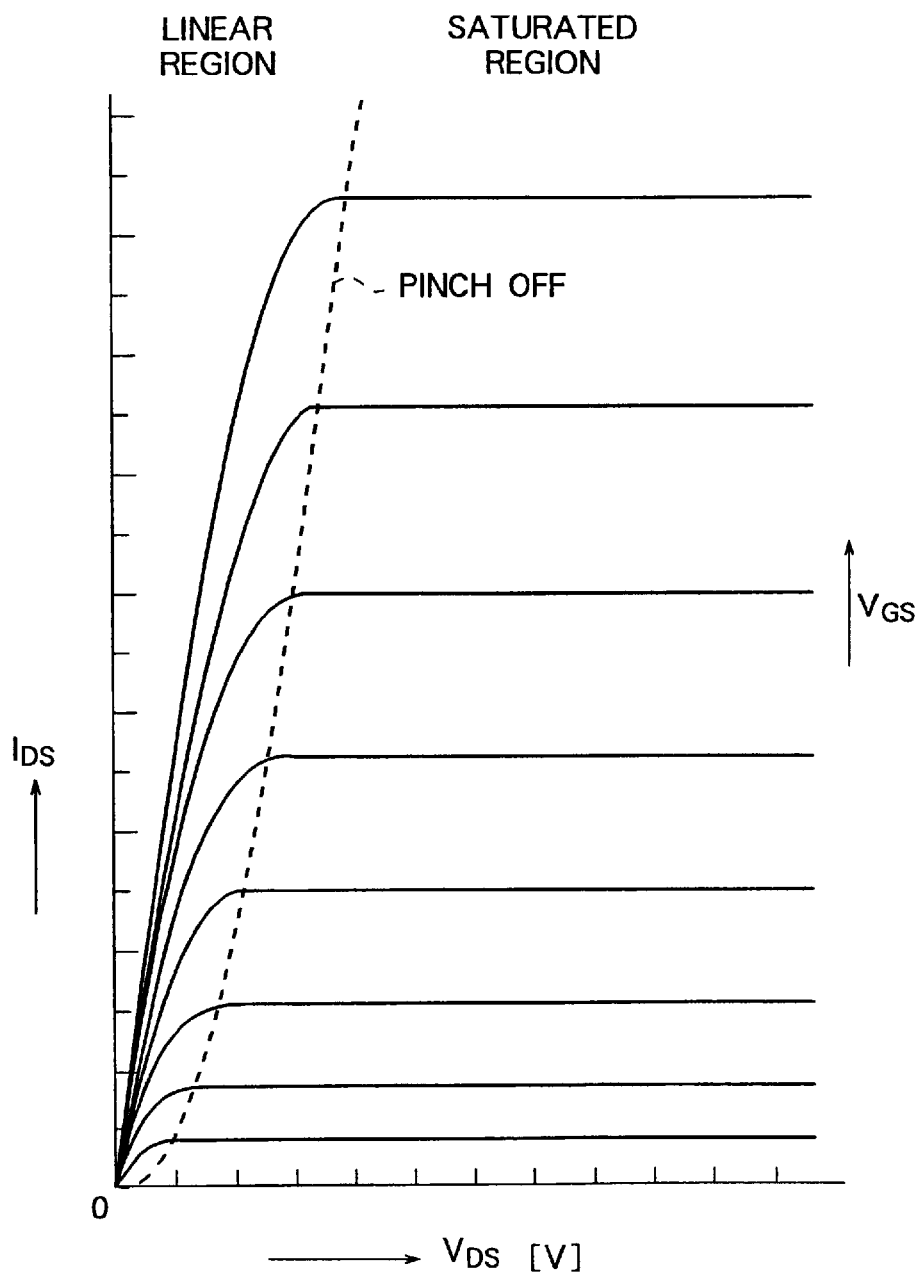
FIG. 9 is a graph showing a current-voltage characteristic of a typical MOSFET.

FIG. 9 graphically shows a well-known relationship between source-drain voltage ($V_{DS}$) and drain current ($I_{DS}$) of a typical MOSFET, with a gate-source voltage ($V_{GS}$) being a parameter. The operational range of the MOSFET is divided into a linear region and a saturation region across a boundary defined by a locus of pinch-off points shown in dotted lines in FIG. 9.

As is well known in the art, the drain current $I_{D(SAT)}$ of the P-channel MOSFET 711 shown in FIG. 7 in its saturation range, namely, the first constant current $I_{P1}$, is given by the equation indicated below:

$$I_{D(SAT)} = (\beta/2) \cdot (W/L) \cdot (V_{GS} - V_T)^2$$

wherein $V_T$ represents a threshold voltage of the gate-source voltage $V_{GS}$, and $\beta$ represents an element parameter for representing a gain constant. If the gate width W is reduced in order to reduce the parasitic capacitance, it results in reduction of the drain current $I_{D(SAT)}$ or first constant current $I_{P1}$. In order to secure a sufficient amount of constant current $I_{P1}$ in this case, the gate-source voltage $V_{GS}$ must be increased. However, if the gate-source voltage $V_{GS}$ is to be increased, it results in that the saturation range for the MOSFET will be narrowed, with a consequence that the dynamic range of the current source will be reduced. In order to enable a stable operation of the current source, it is necessary to secure a sufficient dynamic range. Therefore, it will be seen that there is a limitation on reducing the parasitic capacitance in a MOS integrated circuit. The present invention provides a new approach for reduction of the problem jitter.

Now, preferred embodiments of the present invention will be described with reference to the accompanying drawings, wherein similar constituent elements are designated at the same or related reference numerals or characters throughout the drawings.

Figure 10:
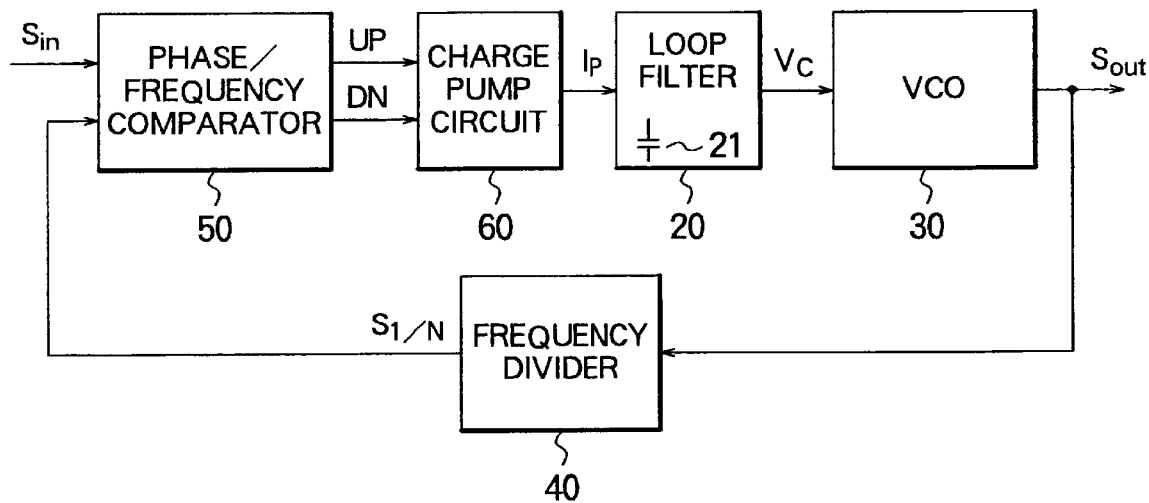
FIG. 10 is a block diagram of a PLL including a charge pump circuit according to an embodiment of the invention.

Referring to FIG. 10, there is shown a phase locked loop (PLL) including a charge pump circuit according to a first embodiment of the invention. The PLL comprises a loop filter 20, a voltage controlled oscillator (VCO) 30, a frequency divider 40, a phase/frequency comparator 50 and a charge pump circuit 60, all of which are cascaded to form a feed-back loop.

The loop filter 20 includes a capacitor 21 therein for generating a control voltage Vc across the capacitor terminals for the VCO 30. The VCO 30 generates output signal Sout having a frequency fout based on the control voltage Vc. The frequency divider 40 divides the frequency of the output signal Sout by a specified factor (1/N), thereby producing a divided-frequency signal $S_{1/N}$.

The phase/frequency comparator 50 compares the divided-frequency signal $S_{1/N}$ with a reference frequency signal Sin having a reference frequency fin, so as to detect a phase/frequency difference Δf between the reference frequency signal Sin and the divided-frequency signal $S_{1/N}$, thereby generating UP signal and DOWN (DN) signal depending on the phase/frequency difference Δf. In response to UP signal, the charge pump circuit 60 provides a control current $I_P$ to the loop filer 20 so as to charge the capacitor 21 therein. In response to DN signal, the charge pump circuit 60 drains therethrough a control current $I_P$ from the loop filter 20 so as to discharge the capacitor 21 therein.

Figure 11:
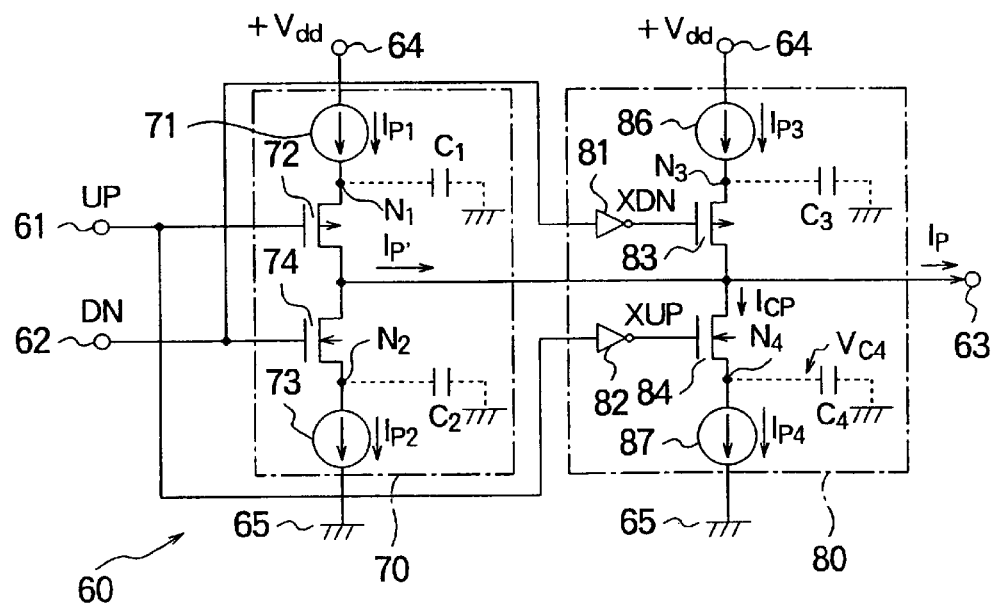
FIG. 11 is a circuit diagram of the charge pump circuit shown in FIG. 10.

Referring to FIG. 11, the charge pump circuit 60 according to the first embodiment of the invention includes a main circuit block 70 having a configuration similar to that of the charge pump circuit 601 of FIG. 1 and an auxiliary circuit block, called herein excess current cancel block 80. The main circuit block 70 has a first input terminal 61 for receiving UP signal, a second input terminal 62 for receiving DN signal, an output terminal 63 through which electric charge is provided to or drained from the loop filter 20 in FIG. 10, a power supply terminal 64 connected to line voltage +Vdd, and a ground terminal 65. UP signal is active when it is at a low level while DN signal is active when it is at a high level.

The main circuit block 70 comprises therein a first current source 71, a first P-channel MOSFET 72, a second current source 73, and a first N-channel MOSFET 74. The first current source 71 is connected to the power supply terminal 64 for supplying a first constant current $I_{P1}$. The first P-channel MOSFET 72 has a source connected to the first current source 71, a gate for receiving UP signal and a drain connected to the output terminal 63. The first P-channel MOSFET 72 supplies first constant current $I_{P1}$ to the output terminal 63 in response to UP signal. The second current source 73 is connected to the ground terminal 65 for supplying a second constant current $I_{P2}$. The first N-channel MOSFET 74 is connected between the second current source 73 and the output terminal 63, and drains the second constant current $I_{P2}$ from the output terminal 63 in response to DN signal.

The excess current cancel block 80 operates to cancel the spike currents supplied from the parasitic capacitances in response to UP signal and DN signal. Specifically, the excess current cancel block 80 comprises first and second inverters 81 and 82 for receiving UP signal and DN signal, respectively, a second P-channel MOSFET 83 for switching, a second N-channel MOSFET 84 for switching, and third and fourth current sources 86 and 87.

The first inverter 81 inverts DN signal to generate an inverted DN (XDN) signal. The third current source 86 is connected to the power supply terminal 64 to provide a third constant current $I_{P3}$ to the output terminal 63 through the second P-channel MOSFET 83. The third constant current $I_{P3}$ for raising the potential at the output terminal 63 is significantly smaller than the second constant current $I_{P2}$ defined by the second current source 73 for lowering the potential at the output terminal 63 (i.e., $I_{P3} \ll I_{P2}$).

The second P-channel MOSFET 83 is connected between the third current source 86 and the output terminal 63, and supplies the third constant current $I_{P3}$ to the output terminal 63 in response to XDN signal.

The second inverter 82 inverts UP signal to generate an inverted UP (XUP) signal. The fourth current source 87 is connected to a ground terminal 65 to define a fourth constant current $I_{P4}$ for lowering the potential at the output terminal 63, the fourth constant current $I_{P4}$ being significantly smaller than the first constant current $I_{P1}$ for raising the potential at the output terminal 63 (i.e., $I_{P4} \ll I_{P1}$).

The second N-channel MOSFET 84 is connected between the fourth current source 87 and the output terminal 63 to drain the fourth constant current $I_{P4}$ for lowering the potential at the output terminal 63 in response to XUP signal.

A first node N1 between the first current source 71 and the first P-channel MOSFET 72, a second node N2 between the second current source 73 and the first N-channel MOSFET 74, a third node N3 between the third current source 86 and the second P-channel MOSFET 83, and a fourth node N4 between the fourth current source 87 and the second N-channel MOSFET 84 are associated with first to fourth parasitic capacitances C1, C2, C3 and C4, respectively, between the respective nodes and the ground. The first to fourth parasitic capacitances C1 to C4 have values in arrange from 0.05 pF to 0.1 pF. The first and fourth parasitic capacitances C1 and C4 are designed to be substantially equal to each other, and the second and third parasitic capacitances C2 and C3 are also designed to be substantially equal to each other. Thus, C1=C4 and C2=C3. With the excess current cancel block 80 thus constructed, the spike currents supplied from the parasitic capacitances C1 and C2 in the main circuit block 70 can be canceled by controlling the second P-channel MOSFET 83 and second N-channel MOSFET 84 in response to XDN and XUP signals, respectively.

To achieve the equality C2=C3, for example, the layout of the third current source 86 including a MOSFET 861 (corresponding to MOSFET 711 in FIG. 7) and the second P-channel MOSFET 83 are designed to be similar to the layout of the second current source 73 including a MOSFET and the first N-channel MOSFET 74.

Figure 12:
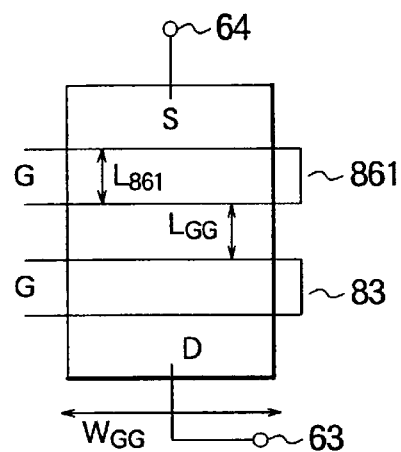
FIG. 12 is a plan view of the second P-channel MOSFET and the P-channel MOSFET in the excess current cancel block, both shown in FIG. 11.

The third constant current $I_{P3}$ can be designed to be smaller than the second constant current by employing a configuration such that the gate length $L_{861}$ of the P-channel MOSFET 861, as shown in FIG. 12, is larger than the gate length of the first N-channel MOSFET of the second current source 73. The same applies to the case of the fourth current source 87 with respect to the first current source 71.

Figure 13:
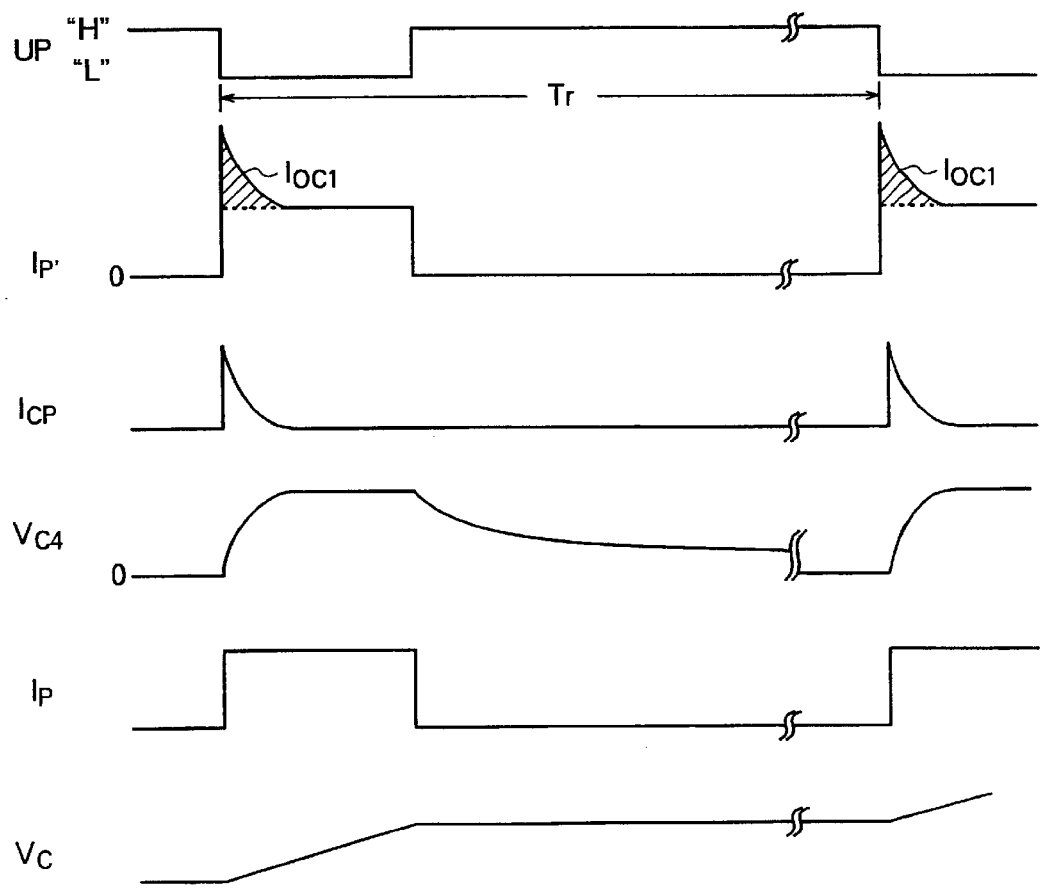
FIG. 13 is a series of timing charts for illustrating the signal waveforms in the charge pump circuit of FIG. 11.

Referring additionally to FIG. 13, the operation of the charge pump circuit 60 shown in FIG. 11 will be described. In the description to follow, the operation which occurs when an active UP signal is supplied to the charged pump circuit 60 will be described, and it should be understood that the operation which occurs when an active DN signal is supplied is similar and therefore will not be specifically described.

FIG. 13 illustrates signal waveforms in the charge pump circuit of FIG. 11, wherein UP signal, control current $I_P'$ supplied from the main circuit block, cancel current $I_{CP}$, terminal voltage $V_{C4}$ across the parasitic capacitor C4, corrected control current $I_P$ and control voltage on the output terminal are consecutively shown.

When UP signal falls to be active, the first P-channel MOSFET 72 is turned on to supply a control current $I_P'$, which includes a spike current $I_{OC1}$ at the leading edge thereof, through the output terminal 63. At the same time, XUP signal is supplied to the gate of the second N-channel MOSFET 84, which is also turned on to charge the fourth parasitic capacitance C4 from the output terminal 63. That is, a charging current or a cancel current $I_{CP}$ having substantially the same shape and magnitude as that of the spike current $I_{OC1}$ flows from the output terminal to the fourth parasitic capacitance C4, and hence, a modified control current $I_P$ in the form of a flat pulse flows through the output terminal 63 to the loop filter 20. Accordingly, the control voltage Vc rises with a designed gradient in the capacitor of the loop filter, the gradient being determined by the first constant current $I_{P1}$ (or modified control current $I_P$) and the capacitance of the capacitor in the loop filter.

When UP signal again rises to be inactive, both the first P-channel MOSFET 72 and second N-channel MOSFET 84 are turned off, whereby the charge on the fourth parasitic capacitor C4 is discharged to the ground to lower the voltage $V_{C4}$. After the PLL is locked in phase with the reference frequency signal, a time interval between the adjacent rises of UP signal, or a repetition period Tr in UP signal is significantly long as compared to the time constant for the discharge of the parasitic capacitance C4. Accordingly, the fourth parasitic capacitance C4 is completely discharged during the interval corresponding to the pulse repetition period Tr, whereby the voltage $V_{C4}$ is substantially equal to zero before UP signal again rises. Consequently, when next UP signal is supplied to the charge pump circuit 60, it repeats the above described operation. In this manner, the output terminal 63 supplies the corrected control current $I_P$ in the form of a rectangular pulse in which the excess current $I_{OC1}$ is canceled.

Figure 6:
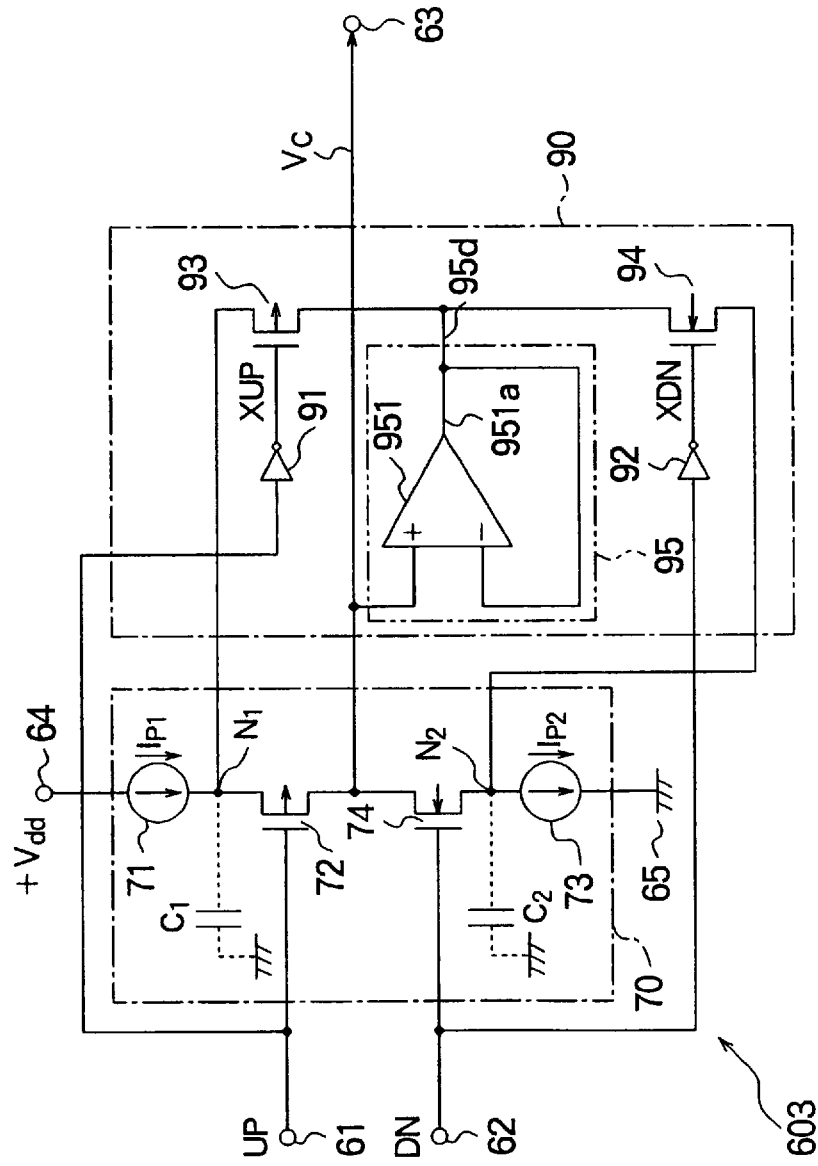
FIG. 6 is a circuit diagram of a third conventional charge pump circuit.

Since the inverters 81 and 82 has a high operational speed corresponding to a time delay which is equal to or less than 1 nanosecond, they operate at a higher speed as compared to the conventional circuit arrangement which includes an operational amplifier. In addition, the area occupied by the excess current cancel block 80 can be reduced by a factor of ten or more as compared with the potential equalizing block 90 shown in FIG. 6.

Figure 14:
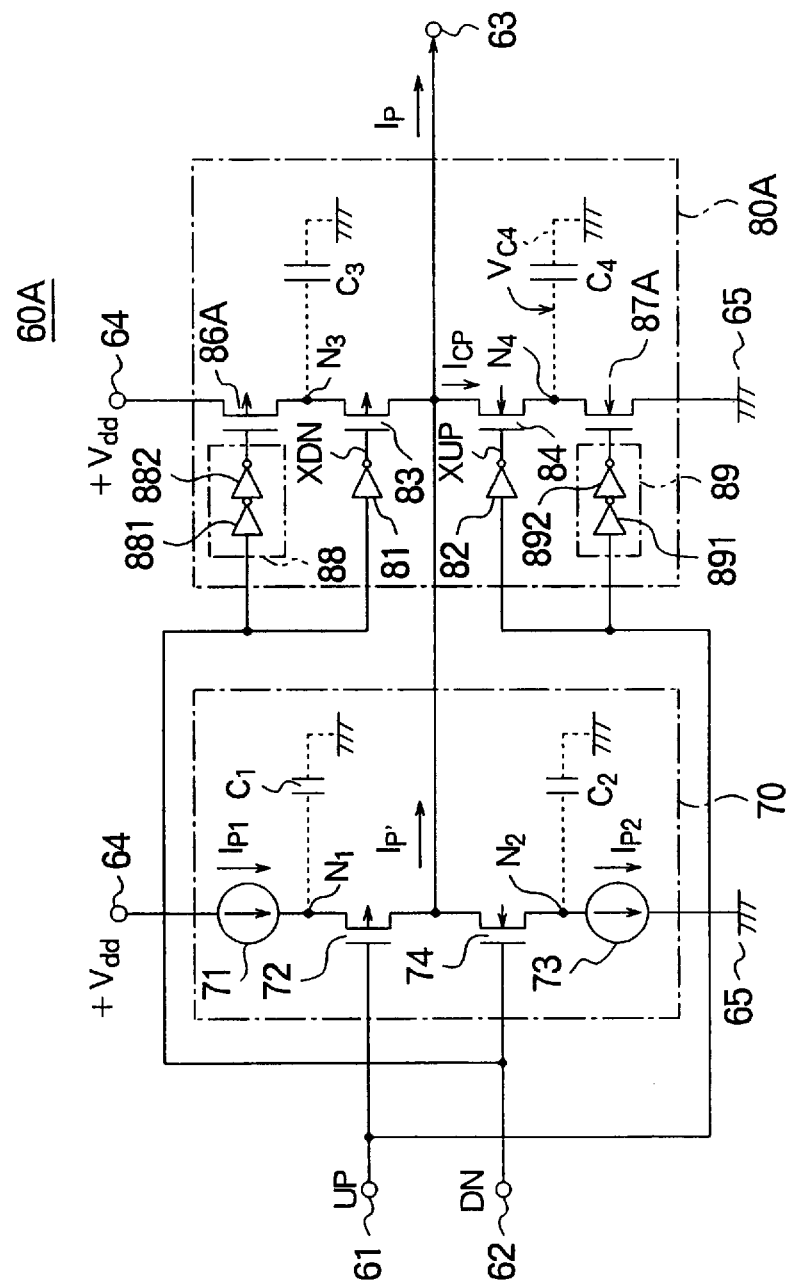
FIG. 14 is a circuit diagram of a charge pump circuit according to a second embodiment of the invention.

FIG. 14 shows a charge pump circuit according to a second embodiment of the invention generally designated at 60A, which has a configuration similar to the configuration of the charge pump circuit of FIG. 11 except for the arrangement of the excess current cancel block 80A.

The excess current cancel block 80A is similar to the excess current cancel block 80 shown in FIG. 11 except that, in this embodiment, a third P-channel MOSFET 86A for switching and a first modification section 88 are provided instead of the third current source 86 shown in FIG. 11, and a third N-channel MOSFET 87A for switching and a second modification section 89 are provided instead of the fourth current source 87 shown in FIG. 11.

The first modification section 88 modifies DN signal into a modified DN (DN') signal in the form of a pulse having a leading edge which precedes the leading edge of XDN signal provided by the first inverter 81 and a trailing edge which follows the trailing edge of XDN signal. Similarly, the second modification section 89 modifies UP signal into a modified UP (UP') signal in the form of a pulse having a leading edge which precedes the leading edge of XUP signal provided by the second inverter 82 and the trailing edge which follows the trailing edge of the XUP signal. The third P-channel MOSFET 86A has a source connected to the power supply terminal 64, a gate for receiving DN' signal, and a drain connected to the source of the second P-channel MOSFET 83. The third N-channel MOSFET 87A has a source connected to the ground terminal 65, a gate for receiving UP' signal, and a drain connected to the source of the second N-channel MOSFET 84.

In the exemplified configuration, the first modification section 88 comprises a pair of cascaded inverters 881 and 882, and operates to follow the leading edge of DN signal with a very short time delay, but follows the trailing edge of DN signal with a relatively long time delay. Similarly, the second modification section 89 comprises a pair of cascaded inverters 891 and 892, and operates to follow the leading edge of UP signal with a very short time delay, but follows the trailing edge of UP signal with a relatively long time delay.

The excess current cancel block 80A should be constructed to avoid the instant at which both the second P-channel MOSFET 83 and third P-channel MOSFET 86A are on or at which both the second N-channel MOSFET 84 and third N-channel MOSFET 87A are on, because simultaneous ON-state of these MOSFETs may involve a malfunction.

Figure 15:
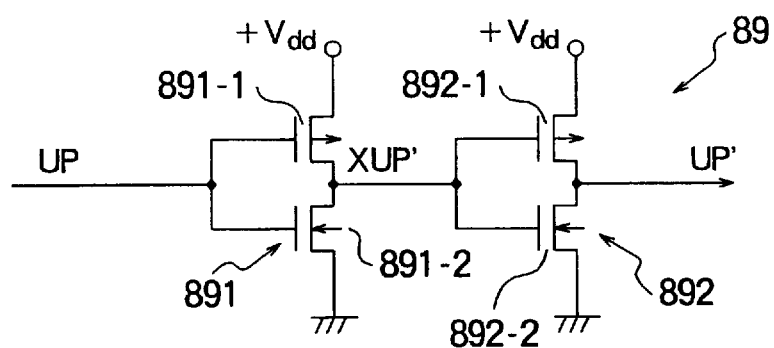
FIG. 15 is a circuit diagram of the second modification block shown in FIG. 14.

FIG. 15 shows a practical circuit configuration for the second modification section 89. A first stage inverter 891 comprises a pair of P-channel MOSFET 891-1 and N-channel MOSFET 891-2. Thus, the inverter 891 implements a push-pull circuit wherein both the gates and drains of P-channel MOSFET 891-1 and N-channel MOSFET 891-2 are respectively connected together. The line voltage +Vdd is applied to the source of the P-channel MOSFET 891-1 while the source of the N-channel MOSFET 891-2 is connected to the ground. It is to be noted that the P-channel MOSFET 891-1 has an area or current capacity which is designed to be greater than usual while the N-channel MOSFET 891-2 has an area or current capacity which is designed to be less than usual. As a consequence, the operational speed for the P-channel MOSFET 891-1 during turn-on is higher than usual while the operational speed for the N-channel MOSFET 891-2 during turn-on is lower than usual.

The second stage inverters 892 also comprises a pair of P-channel MOSFET 892-1 and N-channel MOSFET 892-2. Thus, the inverter 892 implements a push-pull circuit wherein both the gates and drains of P-channel MOSFET 892-1 and N-channel MOSFET 892-2 are connected together, respectively. The line voltage +Vdd is supplied to the source of the P-channel MOSFET 892-1 while the source of the N-channel MOSFET 892-2 is connected to the ground. It is to be noted that both P-channel MOSFET 892-1 and N-channel 892-2 are designed so that they exhibit a higher operational speed than usual.

Figure 16:
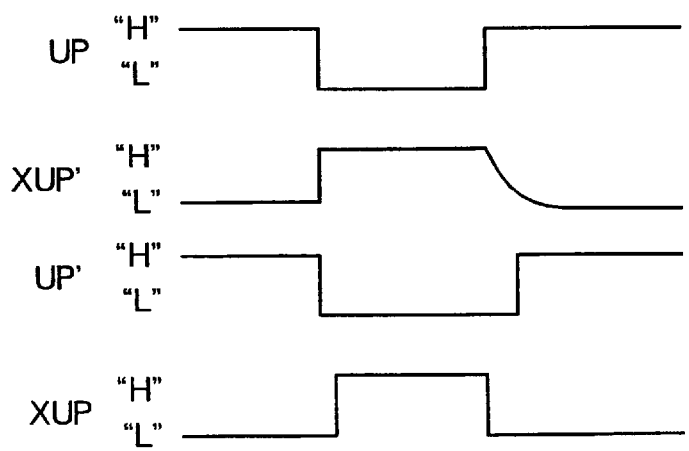
FIG. 16 is a series of timing charts for illustrating the signal waveforms in the second modification block of FIG. 15.

Referring, in addition to FIGS. 14 and 15, to FIG. 16 showing signal waveforms in the second modification section 89, when UP signal falls to be active, P-channel MOSFET 891-1 is turned on with a rise time as low as on the order of several tenth nanoseconds, to thereby raise the output XUP' of the first stage inverter 891 at a high speed. The second stage inverter 892 also exhibits a high operational speed, and accordingly, the output UP' of the second stage inverter 892 falls from a high logic level "H" to its low logic level "L" with a short time delay. On the other hand, the output XUP of the second inverter 82 rises from "L" to "H" after UP' signal falls.

After UP signal rises again to be inactive, since N-channel MOSFET 891-2 in the first stage inverter 891 has a lower operational speed, the output XUP' from the first stage inverter 891 falls slowly from "H" to "L". During the "L" level of XUP' signal, the output XUP of the second inverter 82 falls from "H" to "L". After the completion of the fall of the output XUP of the second inverter 82, the modified output UP' from the second stage inverter 892 rises from "L" to "H".

In this manner, the leading edge of the modified output UP' occurs earlier than the leading edge of XUP signal, and the trailing edge of the modified output UP' occurs later than the trailing edge of XUP signal. Accordingly, the time instant at which both the second N-channel MOSFET 84 and the third N-channel MOSFET 87A are on can be avoided. It will be understood that the first modification section 88 is implemented similarly to the first inverter 81.

The operation of the charge pump circuit 60A itself is similar to that of the charge pump circuit 60 shown in FIG. 11, and therefore will not be described here.

As described above, in the charge pump circuit according to the invention, since the excess current due to the parasitic capacitance can be canceled out, a PLL having the charge pump circuit according to the invention is substantially free from the jitter caused by the excess current from a parasitic capacitance.

Although the present invention is described with reference to preferred embodiments thereof, the present invention is not limited thereto and it will be apparent from those skilled in the art that various modifications or alterations can be easily made without departing from the scope of the present invention as set forth in the appended claims.

What is claimed is:

1. A charge pump circuit for use in a phase locked loop, comprising:
   an output line;
   a main circuit block, said main circuit block having first parasitic capacitances, said main circuit block having first and second inputs receiving a first pulse signal and a second pulse signal, respectively, to output a first current signal and a second current signal through said output line in response to said first pulse signal and said second pulse signal, respectively, each of said first and second current signals having a pulse duration depending on a pulse duration of a corresponding one of said first and second pulse signals and including a spike current depending on a corresponding one of said first parasitic capacitances in said main circuit block; and
   an excess current cancel block having a second parasitic capacitances being equal to and corresponding to each of said first parasitic capacitance, said excess current cancel block having first and second inputs wherein said first input receives second pulse signals and said second input receives said first input signals, and converting said first and second pulse signals to corresponding first inverse pulse signals and second inverse pulse signals, respectively, and further switching to connect said second parasitic capacitance by means of switching transistors directly to said output line in response to a corresponding one of said first and second inverse pulse signals to cancel said spike current.

2. A charge pump circuit according to claim 1, wherein said main circuit block comprises:

a first combination of a first current source and a first switching transistor connected between a first source line and said output line, said first switching transistor receiving said first pulse signal at a control electrode thereof and one of said first parasitic capacitances being associated only with said first switching transistor, and a second combination of a second current source and a second switching transistor connected between a second source line and said output line, said second switching transistor receiving said second pulse signal at a control electrode thereof and the other of said first parasitic capacitances being associated only with said second switching transistor.

3. A charge pump circuit according to claim 2 wherein said excess current cancel block comprises:

a first inverter for receiving said second pulse signal;

a third combination of a third circuit source and a third switching transistor connected between said first source line and output line, said third switching transistor receiving an output from said first inverter at a control electrode thereof and being associated with one of said second parasitic capacitances, a second inverter for receiving said first pulse signal;

a fourth combination of a fourth current source and a fourth switching transistor connected between said second source line and output line, said fourth switching transistor receiving an output from said second inverter at a control electrode thereof and being associated with the other of said second parasitic capacitances.

4. A charge pump circuit according to claim 3, wherein the one and the other of said second parasitic capacitances are substantially equal to the other and the one, respectively, of said first parasitic capacitances.

5. A charge pump circuit according to claim 2 wherein said excess current cancel block comprises:

a first inverter, said first inverter receiving said second pulse signal to output a third pulse signal;

a first delay section, said first delay section receiving said second pulse signal to supply a fourth pulse signal having an active duration starting before the start of said third signal and ending after the end of the third signal;

a pair of third and fourth switching transistors connected between said first source line and output line, said third switching transistor receiving said third pulse signal at a control electrode thereof, said fourth switching transistor receiving said fourth pulse signal at a control electrode thereof;

a second inverter, said second inverter receiving said first pulse signal to supply a fifth pulse signal;

a second delay section, said second delay section receiving said first pulse signal to supply a sixth pulse signal having an active duration starting before the start of the fifth pulse signal and ending after the end of said fifth pulse signal; and a pair of fifth and sixth switching transistors connected between said second source line and output line, said fifth switching transistor receiving said fifth pulse signal at a control electrode thereof, said second switching transistor receiving said sixth pulse signal.

6. A charge pump circuit according to claim 5, wherein each of said first and second delay sections has a pair of cascaded inverters, said pair of cascaded inverters responding to the start of a corresponding one of said first and second pulse signals at a first speed and responding to the end of the corresponding one of said first and second pulse signals at a second speed which is lower than said first speed.

7. A charge pump circuit according to claim 6, wherein:

said second parasitic capacitances are associated with a first node connecting said pair of third and fourth switching transistors together and a second node connecting said pair of fifth and sixth switching transistors together, respectively, and the one and the other of said second parasitic capacitances are substantially equal to the other and the one, respectively, of said first parasitic capacitances.

8. The charge pump circuit of claim 5, wherein said third current signal being smaller than said first current signal.

9. The charge pump circuit of claim 5, wherein said fourth current signal being smaller than said first current signal.

10. The charge pump circuit of claim 1, wherein said first and second capacitances have a range substantially between 0.05 pF to 0.1 pF.

11. The charge pump circuit of claim 1, wherein:

said first capacitances comprise a first capacitor and a second capacitor, said second capacitances comprise a third capacitor and a fourth capacitor, and said first capacitor and said fourth capacitor have substantially equal capacitances and said second capacitor and said third capacitor have substantially equal capacitances.

12. A phase locked loop comprising:

a loop filter having a capacitor therein, said loop filter generating a control voltage across said capacitor;

a voltage controlled oscillator generating an output signal having a frequency controlled by said control voltage;

a frequency divider dividing the frequency of the output signal to supply a divided-frequency signal;

a phase/frequency comparator comparing said divided-frequency signal against a reference frequency signal to supply a first pulse signal and a second pulse signal depending on a phase/frequency difference between said divided-frequency signal and reference frequency signal; and a charge pump circuit receiving said first and second pulse signals to charge or discharge the capacitor in said loop filter during an active duration of said first and second pulse signal, said charge pump circuit comprising:

an output line;

a main circuit block, said main circuit block having first parasitic capacitances, said main circuit block having first and second inputs receiving said first and second pulse signals respectively, to output a first current signal and a second current signal though said output line in response to said first and second pulse signals, respectively, each of said first and said second current signals having a pulse duration depending on a pulse duration of a corresponding one of said first and second pulse signals and including a spike current depending on a corresponding one of first parasitic capacitances in said main circuit block; and an excess current cancel block comprising second parasitic capacitances being equal to and corresponding to each of said first parasitic capacitance, said excess current cancel block having first and second inputs wherein said first input receives second pulse signals and said second input receives said first input signals, and converting said first and second pulse signals to corresponding first inverse pulse signals and second inverse pulse signals, respectively, and further switching to connect said second parasitic capacitance by means of switching transistors directly to said output line in response to a corresponding one of said first and second inverse pulse signals to cancel said spike current.

13. A charge pump circuit for use in a phase locked loop, comprising:

an output line;

a main circuit block having first parasitic capacitances, said main circuit block receiving first and second pulse signals to output a first current signal and a second current signal though said output line in response to said first and second pulse signals, respectively, each of said first and said second current signals having a pulse duration depending on a pulse duration of a corresponding one of said first and second pulse signals and including a spike current depending on a corresponding one of first parasitic capacitances in said main circuit block; and an excess current cancel block comprising:

second parasitic capacitances corresponding to each of said first parasitic capacitances, a first inverter receiving said second pulse signal, a first combination of a first circuit source and a first switching transistor connected between said first source line and said output line, said first switching transistor receiving an output from said first inverter at a control electrode thereof and being associated with one of said second parasitic capacitances, a second inverter for receiving said first pulse signal, and a second combination of a second current source and a second switching transistor connected between said second source line and output line, said second switching transistor receiving an output from said second inverter at a control electrode thereof and being associated with the other of said second parasitic capacitances, wherein said excess current cancel block switches to connect said second parasitic capacitance to said output line in response to a corresponding one of said first and second pulse signals to cancel said spike current.

14. The charge pump circuit of claim 13, wherein said main circuit block, comprises:

a third combination of a third current source, a third switching transistor connected between a third source line and said output line, said third switching transistor receiving said third pulse signal at a control electrode thereof and being associated with one of said third parasitic capacitances, said third switching transistor outputting said first current signal through said output line in response to said third pulse signal, a fourth combination of a fourth current source and a fourth switching transistor connected between a fourth source line and said output line, said fourth switching transistor receiving said fourth pulse signal at a control electrode thereof and being associated with the other of said first parasitic capacitances.

15. The charge pump circuit of claim 14, wherein said fourth current source and said first current source are substantially identical.

* * * * *